(12) United States Patent
Lin et al.

(10) Patent No.: US 8,697,196 B2
(45) Date of Patent: Apr. 15, 2014

(54) METHOD OF FORMING A METAL PATTERN

(75) Inventors: Kuan-Jiuh Lin, Taichung (TW);
Chuen-Yuan Hsu, Yunlin County (TW)

(73) Assignee: Kuan-Jiuh Lin, Taichung (TW)

( * ) Notice: Subject to any disclaimer, the term of this patent is extended or adjusted under 35 U.S.C. 154(b) by 579 days.

(21) Appl. No.: 12/470,887

(22) Filed: May 22, 2009

(65) Prior Publication Data

US 2010/0209617 A1    Aug. 19, 2010

(30) Foreign Application Priority Data

Feb. 17, 2009 (TW) ............................... 98104955 A

(51) Int. Cl.
*B05D 3/02* (2006.01)
*H05H 1/00* (2006.01)
*H05H 1/30* (2006.01)
*H05H 1/46* (2006.01)
*H05H 1/24* (2006.01)

(52) U.S. Cl.
USPC ........ 427/535; 427/575; 427/576; 427/376.6; 427/376.7; 427/383.1

(58) Field of Classification Search
USPC ............... 204/192.1, 192.11, 192.12, 192.15, 204/192.25, 192.32, 192.35; 216/63, 64, 216/67, 69; 427/256, 282, 535, 376.7, 427/376.6, 383.1, 533, 575, 576; 219/121.37, 121.59, 121.38
See application file for complete search history.

(56) References Cited

U.S. PATENT DOCUMENTS

| | | | | |
|---|---|---|---|---|
| 4,119,745 A | * | 10/1978 | Smith | 427/66 |
| 5,486,427 A | * | 1/1996 | Koskenmaki et al. | 428/546 |
| 5,843,289 A | * | 12/1998 | Lee et al. | 204/192.3 |
| 6,806,228 B2 | * | 10/2004 | Sharma et al. | 502/439 |
| 6,882,051 B2 | * | 4/2005 | Majumdar et al. | 257/746 |
| 6,962,823 B2 | * | 11/2005 | Empedocles et al. | 438/3 |
| 2008/0008844 A1 | * | 1/2008 | Bettge et al. | 427/576 |

FOREIGN PATENT DOCUMENTS

WO    WO 2007081381 A2 *  7/2007

OTHER PUBLICATIONS

Jain, Prashant, et al., "Calculated Absorption and Scattering Properties of Gold Nanoparticles of Different Size, Shape, and Composition: Applications in Biological Imaging and Biomedicine"; J. Phys. Chem. B, 2006 (American Chemical Society), 110, pp. 7238-7248.

* cited by examiner

*Primary Examiner* — Michael Wieczorek
(74) *Attorney, Agent, or Firm* — Osha Liang LLP

(57) ABSTRACT

A method of forming a metal pattern comprises: (a) providing a substrate; (b) depositing at least one patterned metal layer which includes a metal selected from an inert metal, an inert metal alloy, and combinations thereof; (c) disposing the substrate and the patterned metal layer in a vacuum chamber, vacuuming the vacuum chamber, and introducing a gas into the vacuum chamber; and (d) applying microwave energy to the gas to produce a microwave plasma of the gas within the vacuum chamber so that the patterned metal layer is acted by the microwave plasma and formed into a plurality of spaced apart metal nanoparticles on the substrate.

10 Claims, 6 Drawing Sheets

METHOD OF FORMING A METAL PATTERN

CROSS-REFERENCE TO RELATED APPLICATION

This application claims priority of Taiwanese application No. 098104955, filed on Feb. 17, 2009.

BACKGROUND OF THE INVENTION

1. Field of the Invention

This invention relates to a method of forming a metal pattern, more particularly to a method employing microwave energy to produce microwave plasma for acting on a patterned metal layer, thereby forming nanoparticles exhibiting a specific color in the patterned metal layer.

2. Description of the Related Art

Among existing printing methods, a printing method is chosen according to a material to be printed and a desired color. For example, when a paper sheet is to be printed, a printing medium, such as ink or laser carbon powder, is printed on the paper sheet, which can be conducted by using spray printing technique or screen-printing technique. However, when the material to be printed is not a paper sheet but other materials, an oil-based printing material is used so as to tightly attach thereto. In addition, when the desired color is not a single primary color, various colors are to be created by mixing different colors indifferent ratios. Therefore, there is a need to find a method of making a desired color pattern on different materials that are to be printed.

Nano-material usually includes nanoparticles, nanofiber, nano-film, and nano-bulk. Among others, since nanoparticles have been developed for a longer period of time, technologies thereof are more mature than others. Further, as nanofiber and nano-film are made from nanoparticles, production of nanoparticles is relatively important. In general, methods of producing nanoparticles are classified into physical method and chemical method.

A major example of chemical method is chemical reduction. In the chemical reduction, nanoparticles are formed through reduction of metal ions in a solution, to which a protecting agent is added so as to maintain uniform distribution of the nanoparticles therein and prevent aggregation of the nanoparticles. After the nanoparticles are covered by the protecting agent, a substrate, which has a surface modified with an organic functional group, is provided for formation of a self-assembly nanostructure, such as nanoparticles, thereon through static attraction force and chemical bonding therebetween. Solutions containing organic materials, such as toluene and thiol-containing organic molecules, are usually used in the chemical reduction. However, the organic materials are likely to contaminate the environment and are harmful to human health.

Examples of physical methods for producing nanoparticles include high temperature annealing, electron beam irradiation, heavy ion irradiation, pulsed laser irradiation, and nanolithography. In the first four of the physical methods, a thin film is heated so as to form cracks, become discontinuous, and be melted. Thereafter, spherical nanoparticles are formed by surface tension forces. In the last one of the physical methods, a substrate is covered by a specific mask. For example, nanoscale silicon particles are arranged in a hexagonal closed-packed structure. Subsequently, a metal is deposited on interstices of the hexagonal closed-packed structure such that the nanoparticles are formed and arranged in a triangular array. However, the above-mentioned five physical methods have the following disadvantages.

In the high temperature annealing method, raising and lowering temperature require a long period of time, which results in time-consumption and low efficiency, and non-uniform morphology and easy aggregation of the nanoparticles.

In the electron beam irradiation method, expensive equipment, such as an electron gun, is needed. In addition, since an electron beam generated from the electron gun can merely focus on a limited region on the substrate in each operation, a long time is required for producing nanoparticles on the substrate having a large area. Thus, the method is also less effective.

In the heavy ion irradiation method, the disadvantages are similar to those in the electron beam irradiation method, and the application thereof is still limited to academic study.

The pulsed laser irradiation method is also less effective because a laser source can irradiate only a small region of the substrate and needs to move forth and back to treat a large area of the substrate.

In the nanolithography method, although mass production of nanoparticles is possible, the method is complicated and time-consuming, and requires organic solvents to clean the substrate, which is not environmentally friendly.

SUMMARY OF THE INVENTION

Therefore, an object of the present invention is to provide a method of forming a pattern that can overcome the aforesaid drawbacks associated with the prior art.

According to the present invention, the method of forming a pattern comprises: (a) providing a substrate; (b) depositing at least one patterned metal layer, which includes a metal selected from the group consisting of an inert metal, an inert metal alloy, and combinations thereof; (c) disposing the substrate and the patterned metal layer in a vacuum chamber, vacuuming the vacuum chamber, and introducing a gas into the vacuum chamber; and (d) applying microwave energy to the gas to produce a microwave plasma of the gas within the vacuum chamber so that the patterned metal layer is acted by the microwave plasma and formed into a plurality of spaced apart metal nanoparticles on the substrate.

BRIEF DESCRIPTION OF THE DRAWINGS

Other features and advantages of the present invention will become apparent in the following detailed description of the preferred embodiment of this invention, with reference to the accompanying drawings, in which.

DETAILED DESCRIPTION OF THE PREFERRED EMBODIMENTS

Figure 1:
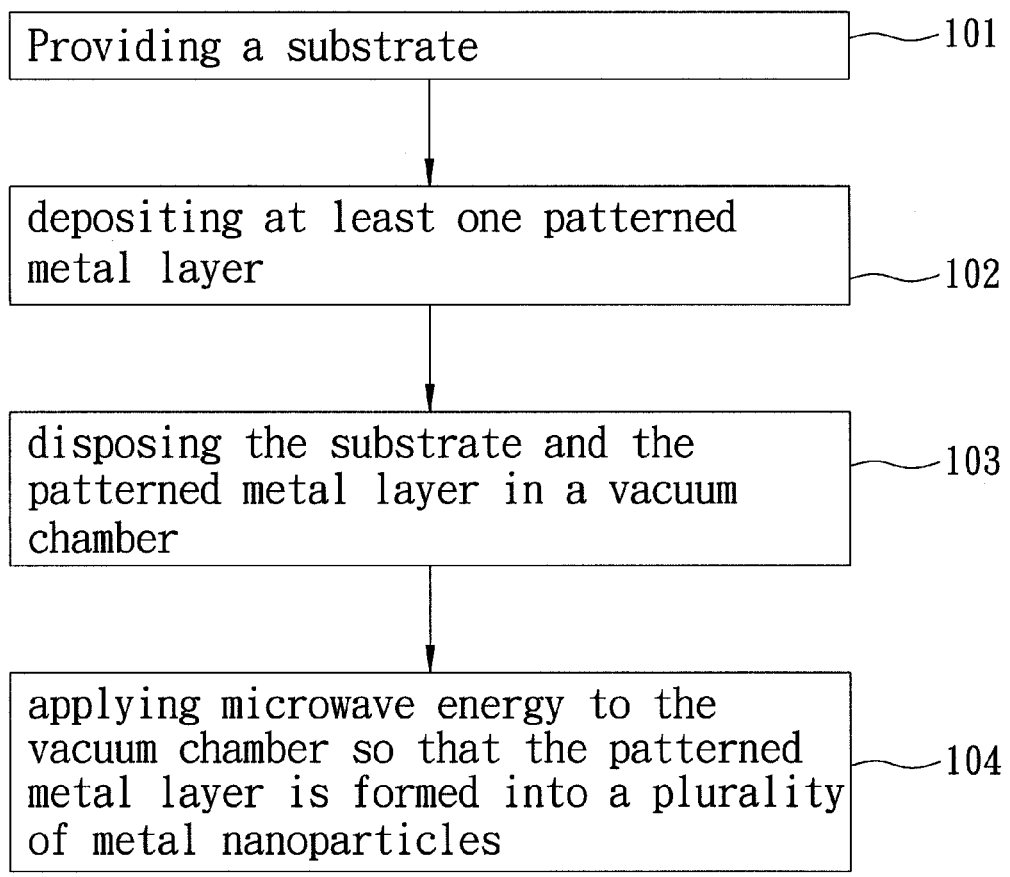
FIG. 1 is a flowchart illustrating consecutive steps of a preferred embodiment of the method of forming a metal pattern according to this invention.
Figure 2A:
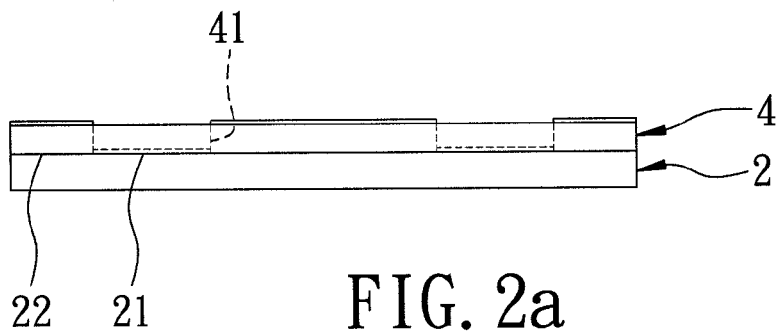
FIGS. 2a to 2c are schematic views to illustrate a patterned metal layer formed on a substrate through a mask and formation of patterned metal nanoparticles after a microwave plasma treatment.
Figure 2B:
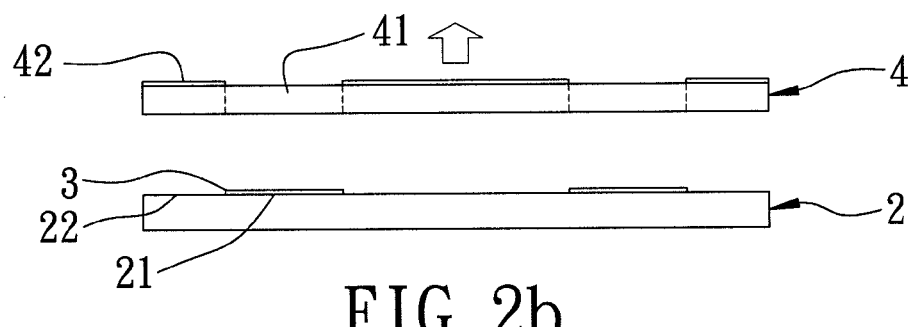
Figure 2C:
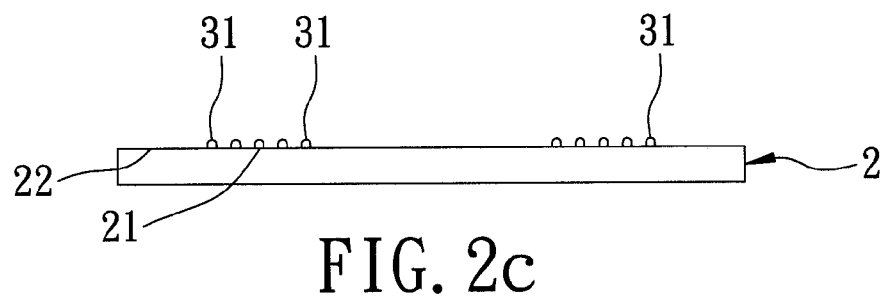

Referring to FIGS. 1, 2a, 2b, and 2c, a method of forming a metal pattern according to a preferred embodiment of the present invention includes steps 101 to 104.

In step 101, a substrate 2 having a glass transition temperature not less than 120° C. is provided and is covered with a mask 4. The mask 4 has a hollow pattern 41 and a non-hollow part 42 so that the substrate 2 has an uncovered region 21 which corresponds to the hollow pattern 41 and which is not covered by the mask 4 and a covered region 22 that corresponds to the non-hollow part 42 and that is covered by the mask 4.

A material for the substrate 2 is not limited. Any suitable material having a glass transition temperature not less than 120° C. can be used. Preferably, the substrate 2 is made from ceramic material. Alternatively, the substrate 2 can be made from a transparent material, such as glass, quartz, mica, sapphire, and ceramics. In this embodiment, the substrate 2 has a transparency not less than 85%.

In step 102, a metal layer having a predetermined thickness is deposited on the uncovered region 21 of the substrate 2, thereby forming a patterned metal layer 3. The patterned metal layer 3 includes a metal which is selected from the group consisting of an inert metal, an inert metal alloy, and combinations thereof. Preferably, the metal is selected from the group consisting of gold, silver, gold alloy, and combinations thereof.

In this embodiment, the patterned metal layer 3 is formed on the substrate 2 using sputter coating and has a predetermined thickness controlled using a film thickness measuring instrument (F.T.M).

Preferably, the patterned metal layer 3 has a layer thickness ranging from 1 nm to 20 nm. By controlling the thickness of the patterned metal layer 3, a diameter of the produced metal nanoparticles can be controlled.

In step 103, the mask 4 is removed, and the substrate 2 and the patterned metal layer 3 are disposed in a vacuum chamber (not shown). Subsequently, the chamber is vacuumed and a gas is introduced into the chamber. In this embodiment, the chamber has a pressure ranging from 0.2 torr to 6.0 torr. The gas is selected from the group consisting of argon, nitrogen, oxygen, and combinations thereof.

In step 104, microwave energy is supplied to the chamber for a predetermined time so that the gas in the chamber is formed into a microwave plasma which acts on the patterned metal layer 3, thereby melting the patterned metal layer 3 and forming a plurality of spaced apart metal nanoparticles 31 on the uncovered region 21 of the substrate 2. In this embodiment, by controlling the thickness of the patterned metal layer 3, the particle size of the metal nanoparticles 31 can be controlled to range from 3 nm to 200 nm. In practical use, the particle diameter of the metal nanoparticles 31 is not limited and may be increased by increasing the thickness of the patterned metal layer 3.

In addition, a duration time of the microwave energy may be varied depending on the layer thickness and an area of the patterned metal layer 3. When the layer thickness and the area of the patterned metal layer 3 are large, more energy is required for melting the patterned metal layer 3, thereby increasing the duration time of the microwave energy. Preferably, the microwave energy in step 104 is supplied by a microwave-generating unit. The microwave-generating unit has an output power ranging from 700 W to 1500 W. In this embodiment, the output power is substantially 1100 W and the frequency is set to be 2450 MHz.

In the method of this invention, various metal nanoparticles made of different materials and having different diameters can be produced. In addition, when metals are sized to nanoscale, nano-sized metals exhibit special properties, such as optical effect, due to the d-d transition of electron of the metal nanoparticle which results in an absorption peak in the visible light wavelength region. Therefore, metal nanoparticles having different diameters can present different colors.

It is worth mentioning that, when nanoparticles of a metal alloy are to be produced, a plurality of patterned metal layers 3 must be formed on the substrate 2. After the microwave plasma treatment, the patterned metal layers 3 are melted and mixed together, and then formed into the alloy nanoparticles. The metals for the patterned metal layers 3 may be selected from the group consisting of gold, silver, gold alloy, and combinations thereof. For example, when gold-silver alloy nanoparticles are to be produced, a first layer made of gold is formed on the substrate 2 and a second layer made of silver is formed on the first layer. Subsequently, the metals of the first and second layers are melted and mixed together by the action of the microwave plasma, and are then formed into nanoparticles spontaneously through surface tension forces. Preferably, the patterned metal layers 3 have a total thickness ranging from 1 nm to 20 nm. Each of the patterned metal layers 3 has a thickness ranging from 0.1 nm to 19.9 nm. By controlling the material and the thickness of the patterned metal layers 3, various alloy nanoparticles having different composition ratios can be produced.

The merits of the method of forming a metal pattern according to this invention will become apparent with reference to the following Examples.

EXAMPLES 1 to 3

Example 1

Eight glass specimens having substantially identical size were provided. The specimens were cleaned with acetone, ethanol, and deionized water, and further cleaned using an ultrasonic cleaner for 5 min so as to remove contaminations on the specimens. After a drying treatment using nitrogen gas, the specimens were dipped in a piranha solution containing $H_2SO_4$ and $H_2O_2$ in a ratio of 3:1 at 80° C. for 30 min so as to remove organic residue thereon. Subsequently, the specimens were rinsed with deionized water, and then dried with nitrogen gas.

The eight specimens processed through the aforesaid cleaning steps were placed inside a sputter coater for deposit of a metal layer thereon. A film thickness measurement instrument (F.T.M) was used to control the thicknesses of the metal layers deposited on the specimens to be 1 nm, 2 nm, 3 nm, 4 nm, 5 nm, 6 nm, 7 nm, and 8 nm, respectively. A gold target was used.

Each specimen having the metal layer formed thereon was put in the chamber equipped with a microwave-generating unit. The chamber was vacuumed to a pressure of 0.3 torr using a vacuum unit (not shown), and an argon gas was introduced into the chamber through a gas supply unit (not shown). Subsequently, the micro-generating unit was operated to supply microwave energy to the argon gas so as to produce a microwave plasma of the argon. When the microwave plasma with high energy was applied to the metal layer, the metal layer was gradually melted to form a plurality of spaced apart metal nanoparticles. The duration time of the microwave energy was varied with the thickness of the metal layer. The duration times of the microwave energy for the metal layers with thicknesses of 1 nm, 2 nm, 3 nm, 4 nm, 5 nm, 6 nm, 7 nm, and 8 nm were 30 s, 45 s, 50 s, 55 s, 60 s, 65 s, 70 s, and 75 s, respectively.

Figure 3:
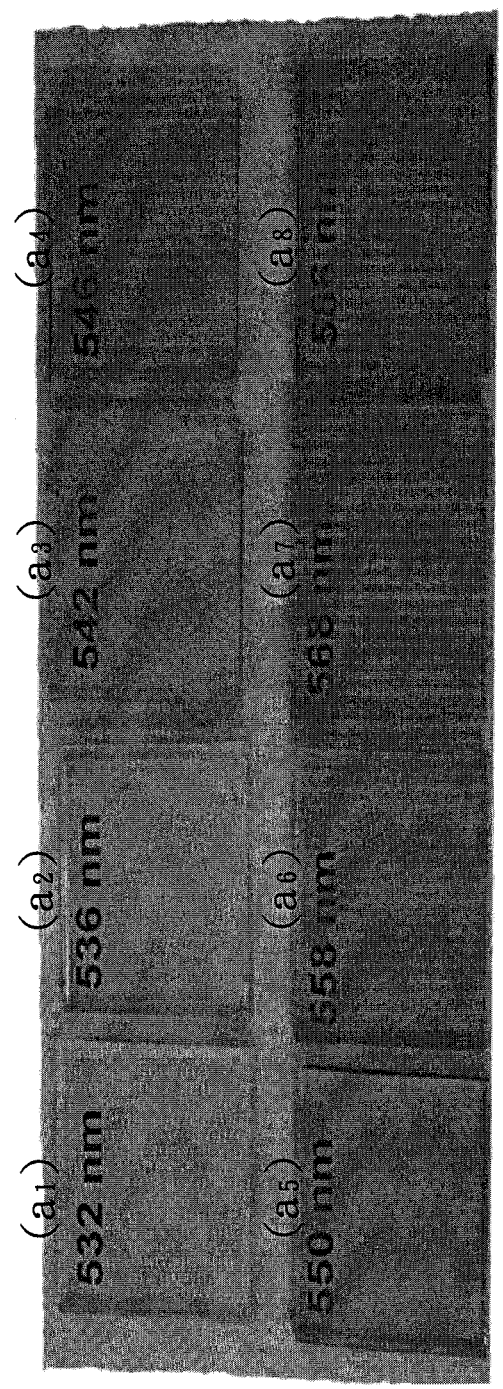
FIG. 3 shows images of metal nanoparticles of Example 1.

The specimens treated by the microwave plasma were labeled as a1, a2, a3, a4, a5, a6, a7, and a8, respectively in the order of from small thickness to large thickness of the metal layers on the specimens and were analyzed using scanning electron microscope (SEM). The particle diameters of some of the selected metal nanoparticles in each SEM image were measured, and an average diameter for the nanoparticles in each SEM image was calculated from the measured particle diameters, as shown in Table 1. By controlling thickness of the metal layer, the diameter of the metal nanoparticles can be varied. Referring to FIG. 3 and Table 1, the wavelength of the absorption peaks of the produced metal nanoparticles varies with the particle diameter of the nanoparticles, and the absorption peaks appear at different wavelengths of the visible light spectrum. Therefore, the metal nanoparticles can exhibit different colors.

TABLE 1

| | Metal layer thickness (nm) | Average diameter (nm) | Absorption peak (nm) | Color |
|---|---|---|---|---|
| a1 | 1 nm | 8 ± 3 nm | 532 nm | Light pink |
| a2 | 2 nm | 13 ± 5 nm | 536 nm | Pink |
| a3 | 3 nm | 17 ± 7 nm | 542 nm | Dark pink |
| a4 | 4 nm | 23 ± 11 nm | 546 nm | Pink purple |
| a5 | 5 nm | 36 ± 13 nm | 550 nm | Light purple |
| a6 | 6 nm | 47 ± 15 nm | 558 nm | Dark purple |
| a7 | 7 nm | 55 ± 19 nm | 568 nm | Light blue |
| a8 | 8 nm | 70 ± 24 nm | 586 nm | Dark blue |

The result shows that the color of the metal nanoparticles can be controlled by changing the diameter thereof. Furthermore, by using a mask, a specific colored pattern can be formed on the substrate.

Example 2

Figure 4:
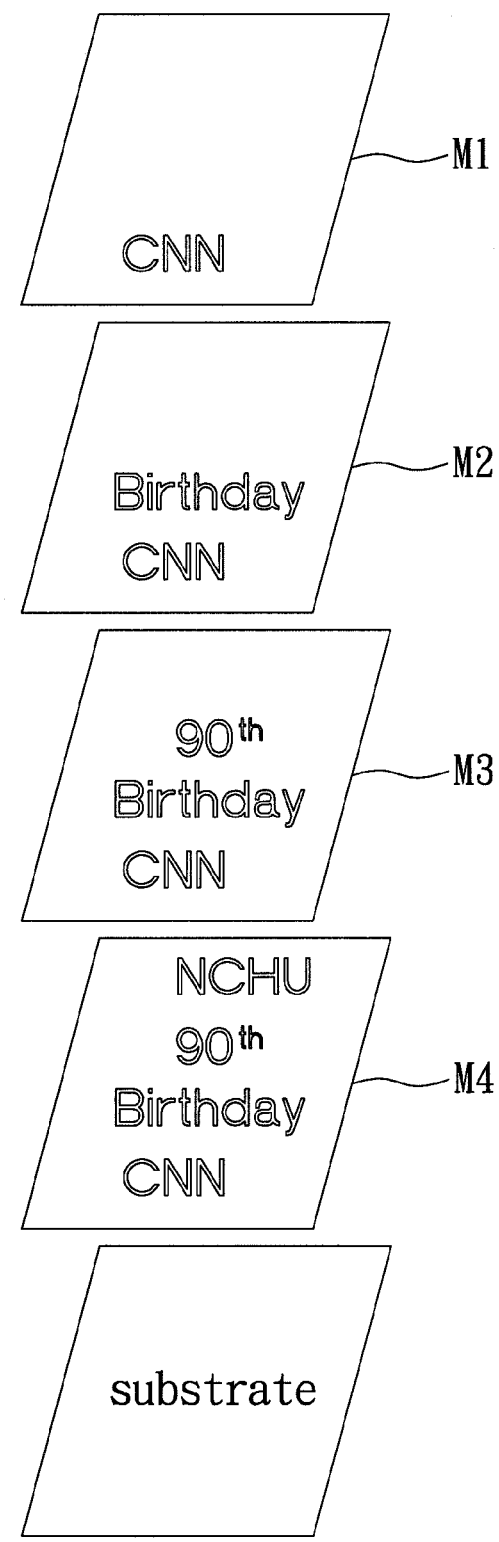
FIG. 4 is a schematic view to illustrate four masks with different patterns used in Example 2.
Figure 5:
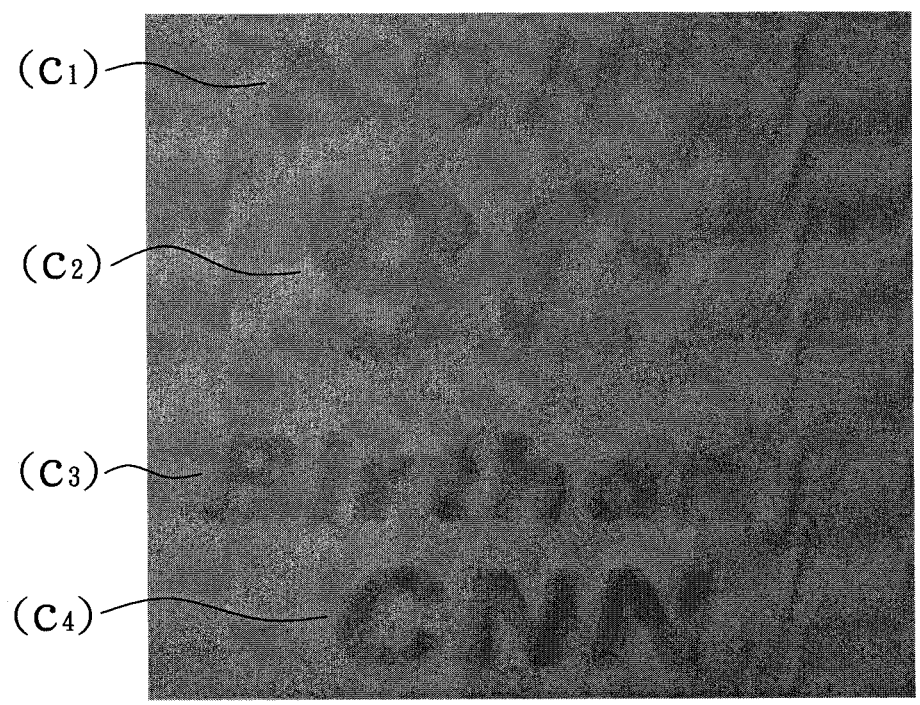
FIG. 5 is an image of the patterned metal nanoparticles of Example 2.

Example 2 was carried out following the procedure of Example 1. However, a glass specimen was used as a substrate and was covered with four masks M1, M2, M3 and M4 as shown in FIG. 4. The mask M1 had a first hollow pattern (CNN), the mask M2 had the first hollow pattern (CNN) and a second hollow pattern (Birthday), the mask M3 included the first and second hollow patterns (CNN, Birthday) and a hollow third pattern ($90^{th}$), and the mask M4 included the first, second, and third hollow patterns (CNN, Birthday, $90^{th}$), and a fourth hollow pattern (NCHU). The four masks M1, M2, M3 and M4 were stacked in sequence on the substrate such that the same hollow patterns in different masks were aligned with each other, as shown in FIG. 4. A gold target was used to deposit metal layers on the substrate. After deposit of a first metal layer with a thickness of 1 nm on the mask M1, the mask M1 was removed, thereby leaving the first metal layer on the substrate. Subsequently, a second metal layer with a thickness of 1 nm was deposited on the mask M2, and then the second mask was removed. Likewise, third and fourth metal layers which were 1 nm thick were respectively deposited on the masks M3 and M4. After removal of the four masks M1, M2, M3, M4, four patterned metal layers with thicknesses of 4 nm (for CNN), 3 nm (for Birthday), 2 nm (for $90^{th}$), 1 nm (for NCHU) were formed on the substrate. Thereafter, the substrate and the four patterned metal layers were disposed in a chamber, which was vacuumed and into which a gas was introduced to have a pressure of 0.4 torr, and were treated by the microwave energy for 60 s. The nanoparticles thus formed had predetermined diameters obtained by controlling the thicknesses of the four patterned metal layers. The patterns shown in FIG. 5 were respectively labeled as c1, c2, c3, and c4, which exhibit light pink, pink, dark pink, and pink-purple colors, respectively. Furthermore, FIG. 5 also shows that, by using the masks and by controlling the thicknesses of the metal layers, the orientation and particle size of the nanoparticles can be controlled to produce different colors and patterns.

Example 3

Figure 6:
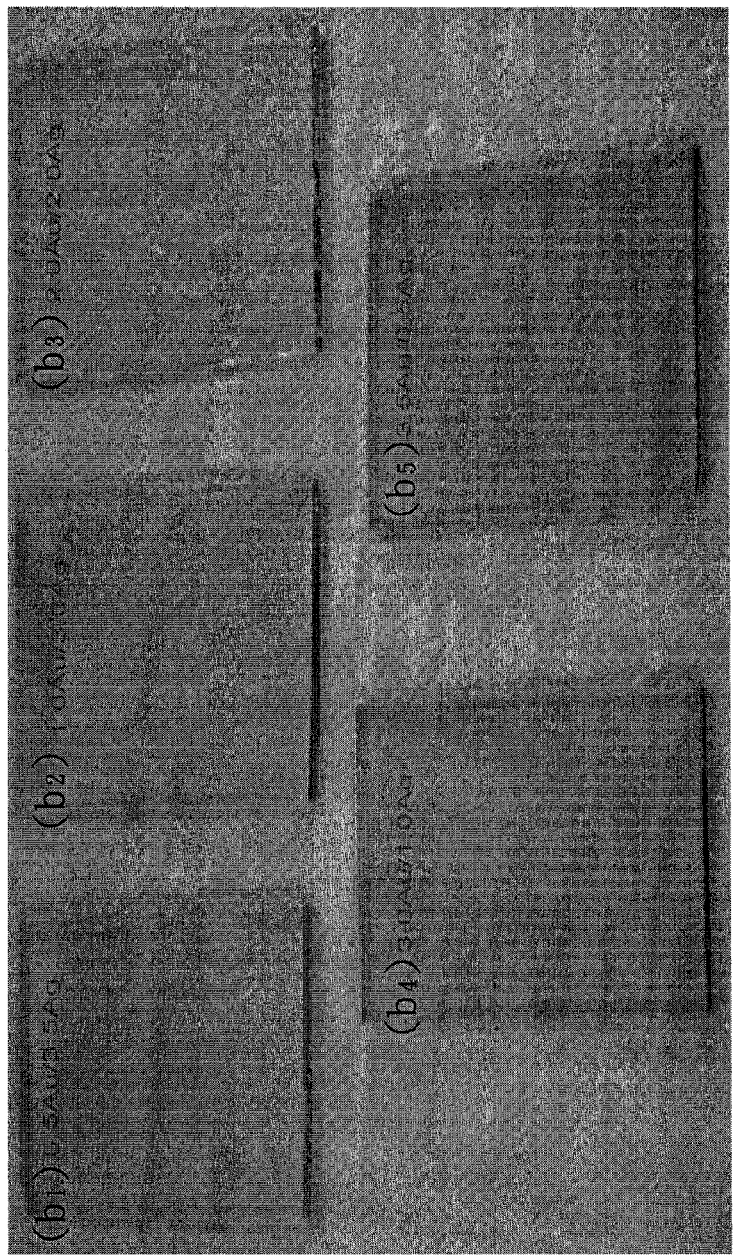
FIG. 6 shows images of alloy nanoparticles of Example 3.

Example 3 was carried out following the procedure of Example 1. However, two metal layers were formed on the substrate. A first layer was deposited on the substrate by sputtering a silver target and then a second layer was formed on the first layer by sputtering a gold target. The resolution of the film thickness measurement instrument was 0.1 nm. The film thickness that can be controlled ranged from 0.1 nm to 999 nm such that the minimal thickness of each layer can be controlled at 0.1 nm. The film thickness measurement instrument was used to control ratio of the thicknesses of the two metal layers and to maintain a total thickness of 4 nm for the two metal layers. Five glass specimens were used in this example, and each specimen was formed with the two metal layers having the total thickness of 4 nm. The five specimens with the thickness ratios of the gold layer to the silver layer were respectively 0.5 nm:3.5 nm, 1.0 nm:3.0 nm, 2.0 nm:2.0 nm, 3.0 nm:1.0 nm, and 3.5 nm:0.5 nm, and labeled as b1, b2, b3, b4, and b5, respectively. The duration time of the microwave energy for each specimen was set to 20 s. After the microwave plasma treatment, the gold-silver alloy nanoparticles thus formed present different colors as shown in FIG. 6. FIG. 6 shows that the color of the five specimens changes from yellow to red-purple as the proportion of the silver in the alloy nanoparticles decreases. In particular, the colors of the five specimens are substantially and respectively yellow, dark yellow, orange, red, and red-purple. The results of FIG. 6 indicate that the color of the alloy nanoparticles can be varied with its composition and its type of material. On the other hand, when a mask is used, the alloy nanoparticles can be patterned. From tests that were conducted on the nanoparticles produced in Examples 1-3, it was found that the nanoparticles were firmly bonded to the substrate and were not easily removed from the substrate. Even when no protecting layer is provided on the nanoparticles, the nanoparticles are not prone to separate from the substrate upon touching the surface of the substrate or applying an electrostatic force. For example, when the metal layer is made of gold, the gold nanoparticle is tightly bonded to the substrate. The bonding strength between the nanoparticles and the substrate increases when the duration time of the microwave energy increases. The reason therefor may be possibly that portions of the nanoparticles are embedded in the substrate by the action of the high temperature microwave plasma.

The invention is advantageous in that the metal nanoparticles can be produced in a short time due to the use of the high temperature microwave plasma. Moreover, when the nanoparticles are produced from a same material or metal, the color of the nanoparticles can be varied by changing the diameter of the nanoparticles. When the nanoparticles are produced from two or more materials or metals, the color of the nanoparticles can be varied by changing the proportions of the materials or metals. When a mask is used, the nanoparticles can be patterned.

In addition, since the nanoparticles are not prone to separate from the substrate, an additional treatment is not required for bonding tightly the nanoparticles on the substrate, and the nanoparticles are not easy to be damaged.

With the invention thus explained, it is apparent that various modifications and variations can be made without departing from the spirit of the present invention. It is therefore intended that the invention be limited only as recited in the appended claims.

What is claimed is:

1. A method of forming a metal pattern, comprising:
    (a) providing a glass substrate;
    (b) depositing at least one metal layer on the glass substrate, the at least one metal layer including a metal selected from the group consisting of an inert metal, an inert metal alloy, and combinations thereof;
    (c) disposing the glass substrate and the at least one metal layer in a vacuum chamber, vacuuming the vacuum chamber, and introducing a gas into the vacuum chamber, the gas being selected from the group consisting of argon, nitrogen, oxygen, and combinations thereof, wherein no mask is provided on the glass substrate and the at least one metal layer; and
    (d) applying microwave energy to the vacuum chamber to produce a microwave plasma of the gas within the vacuum chamber such that the at least one metal layer is melted and acted upon by the microwave plasma and formed into a plurality of spaced apart metal nanoparticles firmly bonded to the glass substrate;
    wherein the microwave energy ranges from 700 W to 1500 W; and
    wherein the thickness of the at least one metal layer ranges from 1 nm to 8 nm.

2. The method of claim 1, further comprising controlling the thickness of the at least one metal layer to obtain a desired particle size of the metal nanoparticles.

3. The method of claim 1, wherein a plurality of the metal layers are formed on the glass substrate, the metal in one of the metal layers being different from that of the other one of the metal layer.

4. The method of claim 1, wherein, in step (b), the at least one metal layer is deposited on the glass substrate by covering the glass substrate with at least one mask, the mask being patterned such that the glass substrate has an uncovered region and a covered region, and wherein the at least one metal layer is deposited on the uncovered region.

5. The method of claim 4, wherein the mask has a hollow pattern corresponding to the uncovered region, and a non-hollow part corresponding to the covered region.

6. The method of claim 5, wherein the glass substrate is covered with at least a pair of the masks, one of the masks having a first hollow pattern, the other one of the masks having the first hollow pattern, and a second hollow pattern, the first hollow pattern in the masks being aligned with each other above the uncovered region.

7. The method of claim 1, wherein the metal is selected from the group consisting of gold, silver, gold alloy, and combinations thereof.

8. The method of claim 1, wherein the metal nanoparticles have a diameter ranging from 8 nm to 70 nm.

9. The method of claim 1, wherein the metal nanoparticles have an absorption peak appearing in a wavelength range of from 532 nm to 586 nm.

10. The method of claim 1, wherein, in step (d), the microwave energy is applied for a time not greater than 75 seconds, the time increasing with the increase of the thickness of the at least one metal layer.

* * * * *